United States Patent [19]

Shepard, Jr.

[11] Patent Number: 4,604,494

[45] Date of Patent: Aug. 5, 1986

[54] PHOTOVOLTAIC CELL ARRAY WITH LIGHT CONCENTRATING REFLECTORS

[75] Inventor: Neal F. Shepard, Jr., King of Prussia, Pa.

[73] Assignee: General Electric Company, Philadelphia, Pa.

[21] Appl. No.: 669,082

[22] Filed: Nov. 7, 1984

[51] Int. Cl.[4] .................. H01L 25/02; H02N 6/00
[52] U.S. Cl. ........................ 136/246; 136/259; 136/244
[58] Field of Search .............. 136/246, 259, 244

[56] References Cited

U.S. PATENT DOCUMENTS

| | | | |
|---|---|---|---|
| 3,446,676 | 5/1969 | Webb | 136/244 |
| 3,459,391 | 8/1969 | Haynos | 244/1 |
| 3,658,596 | 4/1972 | Osborne | 136/251 |
| 3,756,858 | 9/1973 | Dillard | 136/245 |
| 3,819,417 | 6/1974 | Haynos | 136/244 |
| 3,984,256 | 10/1976 | Fletcher et al. | 136/244 |
| 4,086,485 | 4/1978 | Kaplow et al. | 250/203 R |
| 4,361,717 | 11/1982 | Gilmore et al. | 136/246 |

OTHER PUBLICATIONS

*Conference Record, 16th IEEE Photovoltaic Specialists Conf.* (1982), pp. 39-44.

Primary Examiner—Aaron Weisstuch
Attorney, Agent, or Firm—Allen E. Amgott

[57] ABSTRACT

A photovoltaic array having light concentrating reflectors is disclosed which includes a plurality of mutually attached and substantially identical assemblies, each comprising a photovoltaic cell supported within a frame structure opposite a light-concentrating reflector. Electrically conductive struts support the cells while further providing electrical interconnection as well as means for conducting waste heat away from the individual photovoltaic cells.

19 Claims, 4 Drawing Figures

4,604,494

PHOTOVOLTAIC CELL ARRAY WITH LIGHT CONCENTRATING REFLECTORS

The present invention relates in general to a solar battery array and in particular to an array of photovoltaic assemblies including photovoltaic cells and light concentrating reflectors.

BACKGROUND OF THE INVENTION

The use of light concentrating reflectors in a photovoltaic (PV) cell array has the advantage of increasing the efficiency of the PV cell operation, while decreasing the cost per unit of generated power output through the substitution of relatively low cost reflector material for relatively high cost photovoltaic cell material. Meeting both the electrical and thermal requirements of such a concentrating array is, however, a complex and formidable problem. While various methods of interconnecting PV cells into arrays are known in the art, these arrays generally require the use of separate apparatus for mechanically supporting and electrically interconnecting the cells. Not only is the assembly of such apparatus an often intricate, time-consuming and expensive process, but most of these arrays have the further drawback of necessitating the use of heat damageable materials. For example, heat sensitive polymeric wire insulation is often required. Further, heat sensitive adhesive is often used to secure protective cover glass to the PV cell faces. Thus, many of the currently available arrays will not function in a high heat environment which may include externally generated heat-producing particle radiation.

Those prior art arrays which use light concentrating reflectors generally require bulky, intricate, and often unwieldy cooling equipment. For example, U.S. Pat. No. 4,361,717 shows the use of a concentrating reflector in an array which requires a complicated fluid cooling system to dissipate heat. Such a cooling system increases the complexity and weight of the overall array and complicates its assembly, especially when the array is deployed in space. Further, such a cooling system increases the expense of the array.

When it is desired to maximize array protection from particle radiation, it may be necessary to provide special shielding for the side of the array which faces away from the sun. Under these conditions, the heat rejection capability of the anti-sun side is lost and heat rejection depends on the sun-facing side of the array alone. Thus, the demands made of the cooling equipment are increased, requiring still bulkier and more expensive apparatus.

OBJECTS OF THE INVENTION

It is a principal object of the present invention to provide a new and improved PV cell array which is not subject to the aforementioned problems and disadvantages.

Another object of the present invention is to provide a PV cell array which uses light concentrating reflectors to increase the efficiency of the PV cells.

A further object of the present invention is to provide a PV cell array which can utilize light concentrating reflectors without requiring complicated or unwieldy heat dissipation apparatus and which can, with minimal degradation in performance, withstand high transient temperatures such as may be induced by externally generated particle radiation.

A further object of the present invention is to provide a PV cell array which does not require the use of separate structures for supporting and electrically interconnecting the PV cells in the array.

Yet another object of the present invention is to provide a PV cell array which does not require the use of heat damageable materials, such as polymeric electrical wire insulation or cover glass adhesive, in its construction.

A further object of the present invention is to provide apparatus for easily and simply interconnecting a plurality of PV cells in an array.

Another object of the present invention is to provide a new and improved photovoltaic assembly which can be easily and quickly combined with identical assemblies to form a relatively inexpensive array of assemblies.

Yet another object of the present invention is to provide a new and improved PV assembly which can provide the necessary heat rejection for the entire array from the sun-facing array side alone.

A further object of the present invention is to provide a new and improved PV assembly wherein the cells are positioned within the array so as to receive maximum protection from external particle radiation.

SUMMARY OF THE INVENTION

The foregoing and other objects of the present invention are achieved through the use of a new and improved photovoltaic assembly having a light concentrating reflector, which can be quickly combined with identical assemblies to form a solar battery array. In the array the electrical interconnection of the cells is accomplished by the cell support structure. Specifically, a combination of electrical conductors and electrical insulating elements is used to support each cell at the focal point of its reflector, the latter being spaced from the cell. The conductors are connected to the cells and interconnected to each other in a manner which provides both the desired series and parallel electrical connection of the cells.

The cell support structure, in conjunction with the remainder of the array, is configured to reject heat by dissipation into space. This occurs from the sun-facing side of the array alone, where the anti-sun side of the array is shrouded by a panel, e.g. for protection against external particle radiation. Further, the PV cells are positioned within the array in a manner whereby they are shielded from externally generated particle radiation.

DETAILED DESCRIPTION OF THE DRAWINGS

Figure 1:
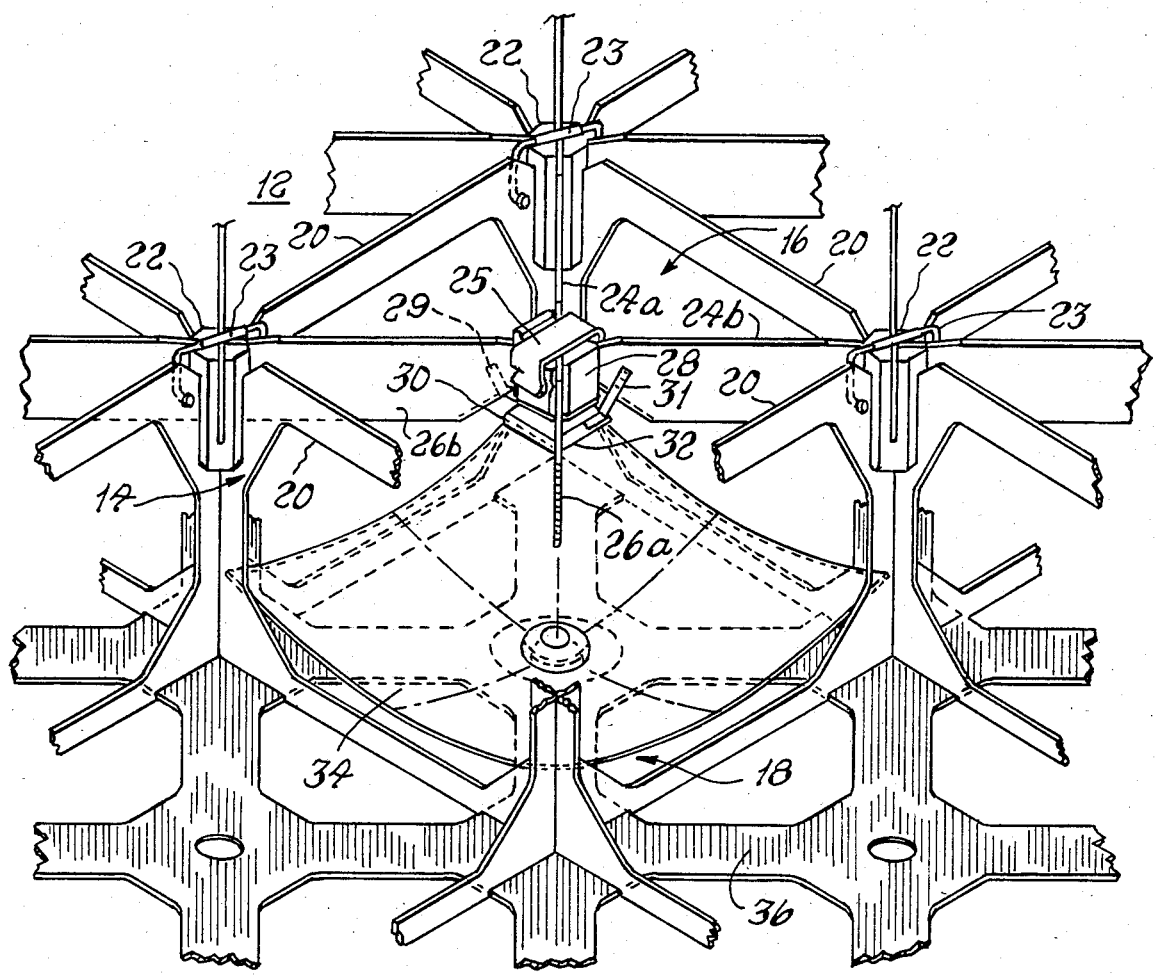
FIG. 1 is a perspective view of a preferred embodiment of the invention, showing a single assembly partially cut away to illustrate interior details.

Referring now to the drawings, FIG. 1 shows a single photovoltaic assembly 12 partly cut away to illustrate interior details. Assembly 12 is adapted to be attached to adjacent, substantially identical assemblies, shown in part in FIG. 1, so as to jointly form a photovoltaic array. Assembly 12 includes a frame structure 14 in the form of a quadrilateral right prism. Frame structure 14 comprises individual frames 20 which jointly define generally square top and bottom prism bases 16 and 18, respectively. Frames 20 individually form common partitions between adjacent PV assemblies.

A first electrically conductive support strut 24, consisting of strut sections 24a and 24b, extends from a pair of adjacent corners of top prism base 16 towards the center of the base. Similarly, a second support strut 26, consisting of strut sections 26a and 26b, extends from the opposite pair of adjacent corners of base 16 towards the center of the base. Support struts 24 and 26 are firmly attached to frame structure 14 at the respective corners of top prism base 16 by means of isolators 22, preferably consisting of a ceramic material, which electrically insulate the struts from the frame structure. At each corner of base 16, an electrically insulating fastener 23 extends across the top of isolator 22 and fastens to a pair of frames of frame structure 14. Fastener 23 thus secures the ends of the struts which are received in isolator 22 against vertical movement, as well as fastening the aforesaid frames to the isolator.

A cell holder 28 is supported by struts 24 and 26, as will become clear in connection with the discussion of FIG. 3 below. A PV cell 30 is attached at one end of cell holder 28 and has a light receiving face 32. Face 32 is oriented towards a light concentrating reflector 34 located proximate to bottom prism base 18. All the PV cell faces in the array lie substantially in a common plane parallel to and positioned between bases 16 and 18. Struts 24 and 26 support cell holder 28, and thus cell 30, within frame structure 14 such that the cell is substantially centered on an imaginary axis extending through the centers of bases 16 and 18.

Cell 30 includes a pair of electrically conductive terminals 29 and 31 which are connected to strut sections 26b and 24b respectively. Thus, struts 26 and 24 are electrically connected to opposite polarity terminals of cell 30. Assembly 12 is shown positioned on a planar back panel 36 which underlies the entire array.

Figure 2:
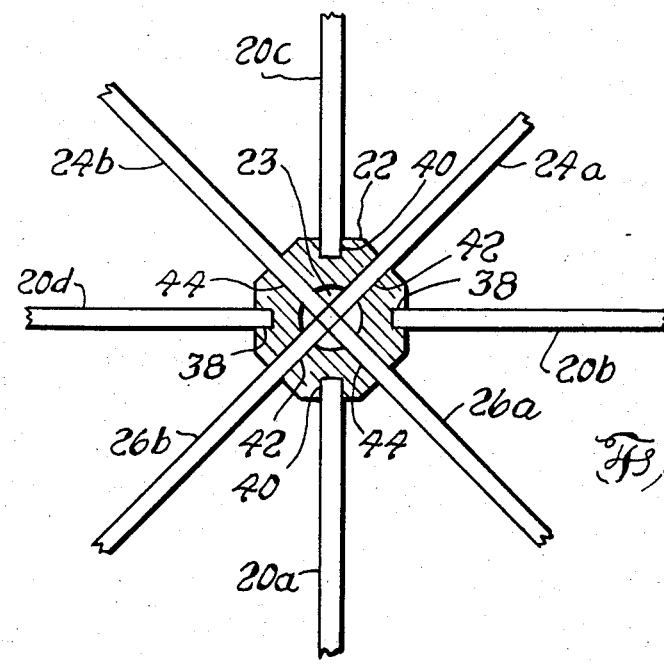
FIG. 2 is a cross-sectional plan view of an isolator and associated structure depicted in FIG. 1.

FIG. 2 shows in greater detail the mechanical interconnection of each isolator 22 with struts 24 and 26 and with frame structure 14. In the illustrated embodiment of the invention, each isolator 22 is shown to consist of an octogonal prism having a hollow cylindrical center 23. Each isolator 22 includes two pairs of oppositely facing, mutually aligned, blind slots 38 and 40 positioned in mutually perpendicular planes. Each of the blind slots is capable of receiving a frame 20 in edgewise relationship. As shown in FIG. 2, each isolator is capable of receiving up to four frames, herein designated 20a, 20b, 20c and 20d.

Isolator 22 further includes two pairs of through slots, 42 and 44, which are positioned in a pair of mutually perpendicular planes rotationally displaced by 45° from the planes of blind slots 38 and 40. Each pair of through slots is adapted to receive a pair of struts endwise from opposite directions. The various components received by each isolator are securely fastened to the latter. Thus, a substantially rigid support structure is provided for each cell holder and for the cell held therein.

In FIG. 2, slots 42 are shown to receive strut sections 24a and 26b, while slots 44 receive strut sections 26a and 24b. These four strut sections are mechanically fastened to each other inside the hollow center 23 of isolator 22, and thus they also form electrical interconnections. By way of example and without limitation, the abutting ends of the aforesaid strut sections may be brazed or otherwise soldered to each other.

Figure 3:
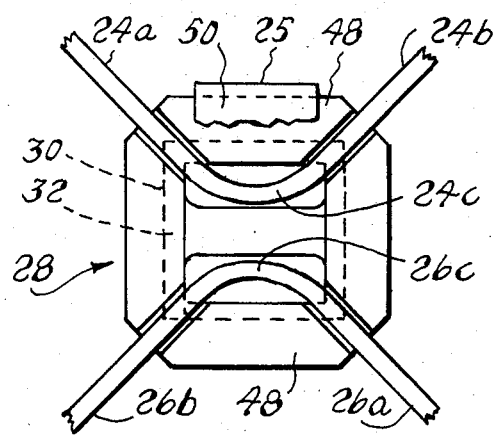
FIG. 3 is a plan view of the cell holder depicted in FIG. 1, partly cut-away for purposes of illustration.

FIG. 3 illustrates the arrangement of struts 24 and 26 inside the surrounding cell holder 28. As shown, strut 24 includes strut sections 24a and 24b on opposite sides of a bend 24c which forms an arc of approximately 90° inside cell holder 28. Similarly, strut 26 includes sections 26a, 26b and a bend 26c between them which also forms a 90° arc proximate bend 24c. Cell 30, which is positioned on the underside of the cell holder, is shown in phantom outline in the drawing and includes light receiving surface 32 which is directed away from the viewer in FIG. 3. A clip 25 snap fits over the top surface and a pair of opposing side walls 48 of cell holder 28, so as to firmly secure struts 24 and 26 to the cell holder.

Figure 4:
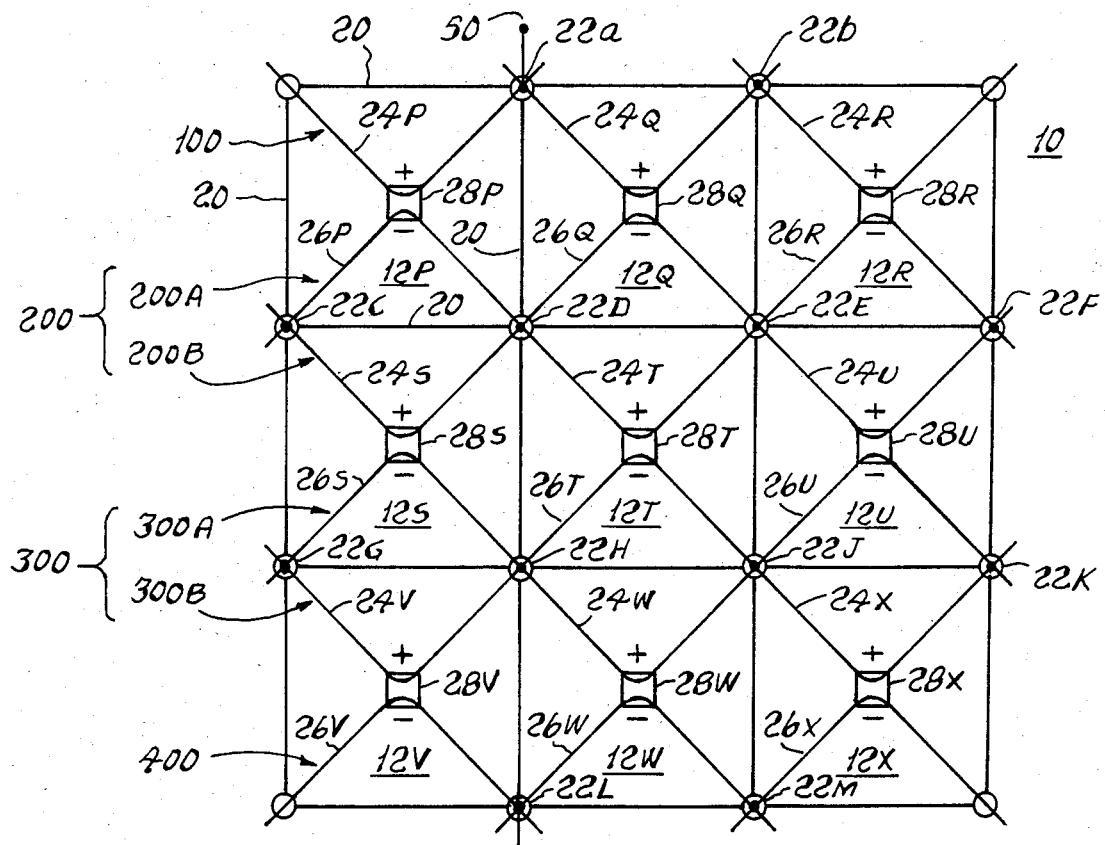
FIG. 4 is a plan view of an array of assemblies of arbitrary size in accordance with the present invention, shown partly in schematic form, with portions omitted for the sake of clarity.

FIG. 4 schematically illustrates the mechanical and electrical interconnections of multiple assemblies 12P through 12X to form an array 10. It is to be understood that array 10 may contain more or fewer assemblies than shown and that all the assemblies are substantially identical. As explained above, the conductive struts entering each isolator 22 are firmly held by the latter, as well as being mechanically and electrically interconnected to form a rigid structure. Thus, strut 24P of assembly 12P is rigidly connected at isolator 22A to strut 24Q of assembly 12Q. Similarly, struts 24Q and 24R of assemblies 12Q and 12R respectively are rigidly interconnected at isolator 22B. Thus, struts 24P, 24Q and 24R jointly form an elongate rigid conductor designated 100 in FIG. 4.

Struts 26P, 26Q and 26R jointly form a rigid conductor half 200A, while struts 24S, 24T and 24U form a rigid conductor half 200B. It will be noted that isolators 22C, 22D, 22E and 22F provide not only the electrical interconnection between struts 26 and 24 respectively, but also accomodate the interconnection of struts 26 and 24 to each other. Thus, conductor halves 200A and 200B together constitute a single, elongate, rigid conductor 200, as indicated in FIG. 4. As shown, each pair of interconnected struts has opposed central bends to form a lozenge-shaped link rigidly connected to identical, adjacent links. Similarly, struts 26S, 26T, and 26U and struts 24V, 24W, and 24X form conductor halves 300A and 300B respectively, which jointly constitute conductor 300. Struts 26V, 26W and 26X jointly form conductor 400. Thus, array 10 includes a succession of elongate, rigid conductors 100, 200, 300, and 400, which are generally parallel to each other.

A series of solar batteries is positioned between each pair of successive conductors. As used herein, the term solar battery designates a photovoltaic cell, its corresponding cell holder and reflector, as well as appropriate interconnecting components. The batteries are preferably positioned such that successive cells of each series are aligned in a row. Thus, the cells indicated by cell holders 28P, 28Q and 28R form a row between the bracketing conductors 100 and 200. The cells of cell holders 28S, 28T, and 28U are aligned in a row between the bracketing conductors 200 and 300, and the cells of cell holders 28V, 28W, and 28X form a row between the bracketing conductor pair 300 and 400. The cells in each row are equidistantly spaced from each other and successive cell rows are likewise spaced at equal distances from each other. The arrangement is such that cells in the preferred array illustrated in FIG. 4 form a matrix of parallel rows and columns. Each cell holder 28 bridges the bracketing pairs of conductors and is firmly attached thereto to provide a substantially rigid cell support structure.

As schematically indicated by the "+" and "−" polarities in FIG. 4, the cells in each battery series have their terminals connected to the respective conductors of the bracketing conductor pair such that all cells in a given series are connected in parallel with each other, and the respective series of batteries are connected seriatim with each other. For example, conductor 200 connects the positive terminals of all cells in the cell row indicated by cell holders 28S, 28T, and 28U. Conductor 300 connects the negative terminals of the same cells. Thus, the cells in the aforesaid row, i.e. cells held by holders 28S, 28T, and 28U, are connected in parallel with each other. Additionally, conductor 300 connects the negative terminals of all cells in cell row 28S, 28T, and 28U with the positive terminals of all cells in the cell row constituted by cell holders 28V, 28W, and 28X. Thus, the two series of batteries, or more specifically the two rows of cells held by holders 28S, 28T, 28U and 28V, 28W, 28X, are connected seriatim, i.e. in series with each other. By tracing through the interconnection of the respective conductors in array 10, it will become apparent that the total voltage of the array appears between a positive array terminal 50 and a negative array terminal 52, shown connected at isolators 22A and 22L respectively.

In operation, array 10 will be positioned such that reflectors 34 face the sun, giving array 10 an anti-sun side generally defined by panel 36 and a sun-facing side as shown facing the viewer in FIG. 1. Light incident on the respective reflectors 34 of array 10 is concentrated on light receiving faces 32 of the corresponding cells 30. Accordingly, each cell develops a voltage potential between its terminals 29 and 31. As explained above, conductive struts 24 and 26 are connected to opposite polarity terminals of cell 30 in each assembly 12, and they are electrically interconnected at their ends to establish the aforesaid parallel and series connections of the cells in the array. Thus, the voltage potential of array 10 varies with the total number of the battery series connected seriatim, while the current capacity of the array varies with the number of solar batteries per series.

If a cell 30 in array 10 should fail so as to produce an open circuit, the array will continue to function at a reduced current capacity. In effect, such a cell failure will result in the removal of that cell alone from its series, thus decreasing the current capacity of that series only. If a cell 30 should develop a short circuit, one entire row of cells will be electrically shorted out. Thus, the array voltage will be reduced by the voltage of one cell.

An important feature of the present invention is that certain structural elements of array 10, i.e. struts 24 and 26, provide mechanical support as well as electrical interconnections for cells 30. The struts, as well as frames 20 and back panel 36 are preferably constructed to be light in weight. Further, the material for these components is selected to be thermally conductive and the components are configured to reject substantial amounts of heat by radiation into space, e.g. by providing large, heat-radiating surface areas. In accordance with the present invention, the thermally conductive components of the array are adapted to reject the heat from the sun-facing array side alone, i.e. without assistance from the back side of the array. Further, each PV cell is seen to be positioned within its assembly such that the assembly structure substantially surrounds the cell face and shields it from externally generated particle radiation which may damage the cell.

By way of example but without limitation, struts 24 and 26, frame structure 14 and back panel 36 may all be constructed from graphite/aluminum materials which are light in weight and which provide good electrical conductivity for the struts and good thermal conductivity for the entire structure. Isolators 22 and cell holder 28 may be fabricated from a ceramic such as beryllium oxide, a lightweight electrical insulator. Cells 30 may be gallium arsenide cells and may be used in combination with segmented paraboloidal concentrating reflectors 34 made of aluminum. With such a combination of materials, a lightweight structure may be constructed which is readily deployable in space and which is more efficient and provides a substantially higher electrical output in absolute voltage and current capacity than similarly sized, conventional, planar silicon cell arrays without concentrators.

While a preferred embodiment of the invention has been described and illustrated, it will be obvious to those skilled in the art that the invention is not so limited. For example, the configuration of the back panel described and illustrated herein may be altered or the panel may be omitted altogether. Further, terminals 29 and 31 may be augmented with redundant pairs of similarly connected terminals, preventing an open circuit fault if one of the terminals should fail.

While the preferred embodiment illustrated herein comprises specific materials and mechanical structures, it will be obvious to those skilled in the art that many variations and substitutions are possible within the purview of the invention as to the materials employed, the physical shape of the structural elements, and the specific interconnection of the respective elements. Thus, numerous modifications, changes, variations, substitutions and equivalents, in whole or in part, will now occur to those skilled in the art without departing from the spirit and scope of the invention. Accordingly, it is intended that the invention herein be limited only by the scope of the appended claims.

What is claimed is:

1. A solar battery array comprising:
   a succession of first and second mutually spaced, elongate, electrical conductors, said first and second conductors alternating with each other and being generally parallel, each of said conductors being substantially rigid and having a configuration adapted to reject substantial amounts of heat by radiation to space;
   a series of mutually spaced solar batteries positioned between successive conductors such that each of said series is bracketed by a first and a second conductor;
   each of said solar batteries including a photovoltaic cell carried by an electrically insulating cell holder, and a reflector spaced from said cell, said reflector being shaped to concentrate incident light on a light receiving cell surface;
   each of said cell holders bridging the bracketing pair of conductors and being fastened thereto to form a substantially rigid cell support structure therewith; and the cells in each of said series of batteries having terminals of opposite polarity connected to respective conductors of the bracketing conductor pair such that all cells in a given series are connected in parallel with each other and the respective series of batteries are connected seriatim;

whereby the voltage potential of said array varies with the total number of said battery series in the array, and the current capacity of said array varies with the number of solar batteries per series.

2. The array of claim 1 wherein said conductors are positioned substantially in a common plane.

3. The array of claim 2 wherein in each of said series said cells are substantially aligned in a row, successive rows of cells being parallel to each other, and the cells in successive rows being equidistantly spaced and aligned to form parallel columns.

4. The array of claim 3 wherein each of said conductors comprises successive, rigidly connected support struts, each of said struts including a central bend of substantially 90° positioned proximate a corresponding central bend of a strut belonging to a neighboring conductor; and each of said cell holders being fastened to a pair of said proximate central bends of a bracketing pair of conductors.

5. The array of claim 4 wherein at least some of said conductors comprise successive pairs of said struts, each of said strut pairs having opposed central bends to form a lozenge-shaped link, successive links of said conductor being rigidly connected to each other.

6. The array of claim 5 and further comprising:
a substantially planar panel;
a frame structure mounted on said panel to support said array at a spaced distance from said panel;
said reflectors being positioned proximate said panel; and
said frame structure and said panel being configured to reject substantial quantities of heat by radiation to space.

7. An array of substantially identical, mutually attached photovoltaic assemblies, each of said assemblies comprising:
a frame structure generally in the shape of a multilateral right prism including first and second mutually spaced, parallel prism bases;
a photovoltaic cell;
means for supporting said cell within said frame structure substantially along an axis through the center of said prism bases, said supporting means including at least first and second electrically conductive support struts each having a configuration adapted to reject heat by radiation to space, said struts extending from respective corners of said first prism base towards said base center, said first and second struts being electrically connected to opposite polarity terminals of said cell;
means for attaching said support struts to said frame structure at said respective corners in a manner whereby said struts are electrically insulated from said frame structure; and
a reflector positioned proximate said second prism base, said reflector being configured to concentrate incident light on said cell.

8. The array of claim 7 wherein each of said cells includes a light-receiving face directed towards its corresponding reflector, said faces lying substantially in a common plane positioned between said prism bases and substantially parallel thereto.

9. The array of claim 8 wherein said cell supporting means further includes means positioned substantially at said base center for holding said cell within said assembly so as to substantially protect it from external particle radiation, said holding means being mechanically connected to said struts and electrically insulated therefrom.

10. The array of claim 9 wherein each of said first and second prism bases has substantially the shape of a square;
said struts extending from opposite pairs of corners of said first prism base and forming a pair of mutually spaced bends proximate each other at said base center; and
said holding means substantially enclosing said pair of bends.

11. The array of claim 10 wherein each of said bends takes substantially the form of a 90° arc.

12. The array of claim 10 wherein in each of said assemblies said frame structure includes a plurality of discrete frames each defining one of the lateral faces of said prism and forming a common partition between adjacent assemblies;
each of said frames having a configuration adapted to reject substantial quantities of heat by radiation to space; and
the frames in each of said assemblies jointly defining said first and second prism bases.

13. The array of claim 12 wherein said assemblies are positioned relative to each other such that said solar cells form mutually perpendicular rows and columns.

14. The array of claim 13 wherein said attaching means includes an electrical isolator positioned at each corner of said first prism base;
each of said isolators including a pair of oppositely facing, mutually aligned, blind slots positioned in first and second mutually perpendicular planes, each of said blind slots being adapted to receive one of said frames in edgewise relationship;
each of said isolators further including at least one through slot positioned in each of third and fourth mutually perpendicular planes, said third and fourth planes being rotationally displaced by 45° from said first and second planes respectively, said through slots being adapted to receive a pair of struts from opposite directions in each of said third and fourth planes respectively; and
means positioned at the center of each of said isolators for electrically interconnecting the struts received by said isolator, said interconnecting means establishing respectively a parallel connection of all the cells in any given row and a series connection of all the cells in any given column;
whereby the voltage and current capacity of said array is increased.

15. The array of claim 14 wherein each of said isolators takes the form of an octogonal prism having a hollow cylindrical center;
each of said third and fourth planes containing a mutually aligned pair of through slots extending from opposite lateral faces of said octogonal prism to said hollow center.

16. A photovoltaic assembly comprising:
a frame structure generally in the form of a multilateral right prism including first and second mutually spaced, parallel prism bases;

a solar cell including a light receiving, planar face positioned between said prism bases and substantially parallel thereto;

means for supporting said cell within said frame structure along an axis extending substantially through the center of said prism bases, said supporting means including at least first and second electrically conductive support struts each having a configuration adapted to reject substantial quantities of heat by radiation to space, said struts extending from opposite corners of said first prism base towards the base center, said first and second struts being electrically connected to opposite polarity terminals of said cell;

said supporting means further including means positioned substantially at said base center for holding said cell, said holding means being mechanically connected to said struts and electrically insulated therefrom;

means for attaching said struts to said frame structure at said opposite base corners in a manner whereby said struts are electrically insulated from said frame structure; and a reflector positioned proximate said second prism base, said reflector being configured to concentrate incident light on said cell face.

17. The assembly of claim 16 wherein each of said first and second prism bases has substantially the shape of a square;

each of said struts including a central bend of approximately 90° and being fastened to said frame structure at a pair of adjacent corners of said first prism base opposite the pair of corners where the other strut is fastened, said bends being mutually spaced and proximate each other at said base center; and said holding means substantially enclosing said pair of bends.

18. The assembly of claim 17 wherein said frame structure includes a plurality of discrete frames each defining one of the lateral faces of said prism, each of said frames having a configuration adapted to reject substantial amounts of heat by radiation to space;

said attaching means including an isolator positioned at each corner of said first prism base;

each of said isolators comprising a pair of oppositely facing blind slots positioned in first and second mutually perpendicular planes, each of said blind slots being adapted to receive one of said frames in edgewise relationship; and at least one through slot positioned in each of third and fourth mutually perpendicular planes, said third and fourth planes being rotationally displaced by 45° from said first and second planes respectively, said through slots being adapted to receive a pair of struts from opposite directions in each of said third and fourth planes respectively.

19. An array of substantially identical, mutually attached photovoltaic assemblies, each of said assemblies comprising:

a frame structure in the shape of a right prism configured to reject substantial amounts of heat by radiation to space, said frame structure including a plurality of rectangular frames each defining a lateral face of said prism and forming a common partition between adjacent assemblies, the frames in each of said assemblies jointly defining first and second mutually spaced, parallel, square prism bases;

a photovoltaic cell including a substantially planar face for receiving light;

means for supporting said cell within said frame structure along an axis through the center of said prism bases, said supporting means including first and second electrically conductive support struts having a configuration adapted to reject substantial amounts of heat by radiation to space, each of said struts extending from a pair of adjacent corners of said first prism base to form substantially a 90° bend near the center of said base;

said supporting means further including means for holding said cell relative to said struts and electrically insulated therefrom, said holding means substantially enclosing said bends and positioning said cell within said assembly so as to substantially protect it from external particle radiation;

means for electrically connecting said first and second struts to opposite polarity terminals of said cell;

an electrical isolator positioned at each corner of said first prism base for attaching said struts to said frame structure, each of said isolators including a hollow cylindrical center and a pair of outwardly facing, mutually aligned, blind slots positioned in first and second mutually perpendicular planes, each of said blind slots being adapted to receive one of said frames in edgewise relationship, each of said isolators further including a pair of mutually aligned through slots positioned on opposite sides of said cylindrical center in each of third and fourth planes respectively, said third and fourth planes being rotationally displaced by 45° from said first and second planes respectively, each pair of said through slots being adapted to receive a pair of said struts endwise from opposite directions;

a light concentrating reflector positioned substantially within said frame structure at the approximate location of said second prism base, said reflector having a configuration adapted to concentrate incident light on said cell face;

said array of assemblies having the cells thereof positioned in mutually perpendicular rows and columns, said cell faces lying in a common plane with each face oriented towards its corresponding reflector, said common plane being parallel to and positioned between a pair of mutually spaced planes which contain said first and second prism bases respectively; and means in said hollow center of each of said isolators for electrically interconnecting the struts received in said isolator through slots, said interconnecting means being effective to connect all the cells of a given cell row in parallel with each other, and to connect all the cells in a given cell column in series with each other;

whereby the voltage and current capacities of said array are increased.

* * * * *